United States Patent
Lee et al.

(10) Patent No.: US 9,425,323 B2
(45) Date of Patent: Aug. 23, 2016

(54) THIN FILM, METHOD OF FORMING THIN FILM, SEMICONDUCTOR DEVICE INCLUDING THIN FILM, AND METHOD OF MANUFACTURING SEMICONDUCTOR DEVICE

(71) Applicant: Samsung Electronics Co., Ltd., Suwon-Si, Gyeonggi-Do (KR)

(72) Inventors: Eun-ha Lee, Seoul (KR); Anass Benayad, Yongin-si (KR); Tae-sang Kim, Seoul (KR); Kyoung-seok Son, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 89 days.

(21) Appl. No.: 14/177,513

(22) Filed: Feb. 11, 2014

(65) Prior Publication Data

US 2014/0225106 A1     Aug. 14, 2014

(30) Foreign Application Priority Data

Feb. 13, 2013   (KR) .......................... 10-2013-0015531

(51) Int. Cl.
*H01L 21/02*   (2006.01)
*H01L 29/786*   (2006.01)
*H01L 29/66*   (2006.01)

(52) U.S. Cl.
CPC ...... *H01L 29/78693* (2013.01); *H01L 21/0257* (2013.01); *H01L 21/02381* (2013.01); *H01L 21/02422* (2013.01); *H01L 21/02521* (2013.01); *H01L 21/02554* (2013.01); *H01L 21/02592* (2013.01); *H01L 21/02631* (2013.01); *H01L21/02664* (2013.01); *H01L 29/66969* (2013.01); *H01L 29/7869* (2013.01)

(58) Field of Classification Search
CPC ...................................................... H01L 29/786
USPC ............................................................ 257/43
See application file for complete search history.

(56) References Cited

U.S. PATENT DOCUMENTS

| 8,173,487 | B2 | 5/2012 | Urayama et al. |
| 2005/0017319 | A1* | 1/2005 | Manabe ............ H01L 21/28185 257/498 |

(Continued)

FOREIGN PATENT DOCUMENTS

| KR | 100407998 | 4/2003 |
| KR | 100857461 | 7/2008 |
| KR | 20100055655 A | 5/2010 |

OTHER PUBLICATIONS

Yan Ye et al., High Mobility Amorphous Zinc Oxynitride Semiconductor Material for Thin Film Transistors, J. Appl. Phys. 106, 074512 (2009); doi: 10.1063/1.3236663.

*Primary Examiner* — Zandra Smith
*Assistant Examiner* — Lawrence Tynes, Jr.
(74) *Attorney, Agent, or Firm* — Harness, Dickey & Pierce, P.L.C.

(57) ABSTRACT

A thin film, a method of forming the thin film, a semiconductor device including the thin film, and a method of manufacturing the semiconductor device include forming a thin film including a metal oxynitride, and treating the thin film with inert gas ions so as to stabilize properties of the thin film. The metal oxynitride may include zinc oxynitride ($ZnO_xN_y$). The inert gas ions may include at least one of Ar ions and Ne ions. The treating of the thin film with the inert gas ions may be performed by a sputtering process, a plasma treatment process, or the like.

15 Claims, 13 Drawing Sheets

(56) References Cited

U.S. PATENT DOCUMENTS

| | | | |
|---|---|---|---|
| 2010/0102315 A1* | 4/2010 | Suzawa | H01L 27/1225 257/43 |
| 2010/0301343 A1* | 12/2010 | Qiu | H01L 29/7869 257/66 |
| 2011/0266537 A1 | 11/2011 | Ye | |
| 2012/0074399 A1 | 3/2012 | Den Boer | |
| 2013/0140553 A1* | 6/2013 | Yamazaki et al. | 257/43 |

* cited by examiner

< COMPARATIVE EXAMPLE >

20 nm

< EXAMPLE EMBODIMENT >

20 nm

< COMPARATIVE EXAMPLE >

< EXAMPLE EMBODIMENT >

< COMPARATIVE EXAMPLE >

< EXAMPLE EMBODIMENT >

THIN FILM, METHOD OF FORMING THIN FILM, SEMICONDUCTOR DEVICE INCLUDING THIN FILM, AND METHOD OF MANUFACTURING SEMICONDUCTOR DEVICE

CROSS-REFERENCE TO RELATED APPLICATIONS

This application claims the benefit of priority under 35 U.S.C. §119 from Korean Patent Application No. 10-2013-0015531, filed on Feb. 13, 2013, in the Korean Intellectual Property Office, the disclosure of which is incorporated herein by reference in its entirety.

BACKGROUND

1. Field

Example embodiments relate to thin films, methods of forming the thin films, semiconductor devices including the thin films, and methods of manufacturing the semiconductor devices, and more particularly, to thin films including metal oxynitride, methods of forming the thin films, transistors including the thin films, and methods of manufacturing the transistors.

2. Description of the Related Art

Semiconductor devices and circuits that are used in various electronic device fields may be manufactured through processes of depositing (stacking) various thin films and patterning the thin films. For example, thin film transistors that are usefully used in a field related to flat panel display devices, such as liquid crystal display devices or organic light emitting display devices, may be manufactured by depositing (stacking) a gate electrode, a channel layer (thin film), a source electrode, a drain electrode, etc. on a glass substrate or a plastic substrate. The performance of a thin film transistor may mainly depend on properties of a channel layer (thin film).

Most of currently commercialized flat panel display devices use thin film transistors including silicon-based channel layers. Recently, in order to improve operating characteristics of thin film transistors, methods of applying a non-silicon material as a channel layer material have been attempted. For example, a method for applying an oxide thin film having high carrier mobility as a channel layer has been attempted. However, if a non-silicon material is applied as a material of a channel layer, the stability and reliability of the channel layer (thin film) may not be secured.

SUMMARY

Example embodiments relate to thin films, methods of forming the thin films, semiconductor devices including the thin films, and methods of manufacturing the semiconductor devices, and more particularly, to thin films including metal oxynitride, methods of forming the thin films, transistors including the thin films, and methods of manufacturing the transistors.

Provided are thin films including metal oxynitride and having stabilized properties and characteristics, and methods of forming the thin films.

Provided are methods of stabilizing properties and characteristics of thin films including metal oxynitride.

Provided are transistors including metal oxynitride as a channel layer material, and having excellent performance and reliability.

Provided are methods of manufacturing the transistors.

Provided are electronic devices (e.g., display devices) including the transistors.

According to some example embodiments, a method of forming a thin film includes forming a preliminary thin film including a metal oxynitride, and treating the preliminary thin film with inert gas ions so as to form the thin film having stabilized properties.

The metal oxynitride may include zinc oxynitride.

The inert gas ions may include at least one selected from the group consisting of Ar ions and Ne ions.

The treating of the preliminary thin film with the inert gas ions may include performing a sputtering process.

The sputtering process may include sputtering the inert gas ions at an acceleration voltage of about 0.5 keV to about 4.0 keV.

The sputtering process may be performed under a pressure of about $10^{-7}$ Pa to about $10^{-6}$ Pa.

The treating of the preliminary thin film with the inert gas ions may include performing a plasma treatment process.

The plasma treatment process may include using a source power of about 50 W to 300 W.

The treating of the preliminary thin film with the inert gas ions may be performed at about room temperature.

According to other example embodiments, a thin film is formed according to the method of forming a thin film.

According to further example embodiments, a thin film includes a metal oxynitride, wherein the thin film satisfies the following inequality, $(I_{max}-I_{min})/I_{avg}<0.3$, where $I_{max}$ and $I_{min}$ denote a maximum intensity and a minimum intensity of a high-angle annular dark-field scanning transmission electron microscope (HAADF STEM) image of the thin film, respectively, and $I_{avg}$ denotes an average intensity of the HAADF STEM image.

The metal oxynitride may include zinc oxynitride.

The metal oxynitride may include amorphous zinc oxynitride, and a content ratio of the amorphous zinc oxynitride in the thin film may be greater than, or equal to, 80%.

According to even further example embodiments, a method of manufacturing a transistor includes forming a channel layer including a thin film, a gate electrode, a source electrode, and a drain electrode, wherein the thin film is formed according to the method of forming a thin film.

The method of manufacturing a transistor may further include forming an etch stop layer on the channel layer.

According to still other example embodiments, a transistor includes a channel layer formed of a metal oxynitride, a gate electrode corresponding to the channel layer, a source electrode connected to a first region of the channel layer, and a drain electrode connected to a second region of the channel layer, wherein the channel layer satisfies the following inequality, $(I_{max}-I_{min})/I_{avg}<0.3$, where $I_{max}$ and $I_{min}$ denote a maximum intensity and a minimum intensity of a high-angle annular dark-field scanning transmission electron microscope (HAADF STEM) image of the channel layer, respectively, and $I_{avg}$ denotes an average intensity of the HAADF STEM image.

The metal oxynitride may include zinc oxynitride.

The metal oxynitride may include amorphous zinc oxynitride, and a content ratio of the amorphous zinc oxynitride in the channel layer may be greater than, or equal to, 80%.

The transistor may further include an etch stop layer on the channel layer.

According to yet further example embodiments, an electronic device including the above-stated transistor is provided.

The electronic device may be a display device.

The display device may be a liquid crystal display device or an organic light emitting display device.

The transistor may be used as a switching device or a driving device.

BRIEF DESCRIPTION OF THE DRAWINGS

Example embodiments will be more clearly understood from the following detailed description taken in conjunction with the accompanying drawings. FIGS. 1-16 represent non-limiting, example embodiments as described herein.

FIG. 5 is a graph illustrating an X-ray photoelectron spectroscopy (XPS) depth profile that shows changes in nitrogen (N) content according to time in a zinc oxynitride ($ZnO_xN_y$) thin film formed according to a comparative example.

FIG. 6 is a graph illustrating an XPS composition analysis result of a zinc oxynitride ($ZnO_xN_y$) thin film formed according to example embodiments;

FIG. 7 is a graph illustrating changes in sheet resistance according to time in zinc oxynitride ($ZnO_xN_y$) thin films formed according to a comparative example and example embodiments;

FIG. 8 is an HAADF STEM image showing deterioration due to an electron beam in a zinc oxynitride ($ZnO_xN_y$) thin film formed according to a comparative example;

FIG. 9 is an HAADF STEM image showing influence of an electron beam on a zinc oxynitride ($ZnO_xN_y$) thin film formed according to example embodiments;

FIGS. 12 through 15 are cross-sectional views of transistors according to still other example embodiments; and FIG. 16 is a cross-sectional view of an electronic device (display device) including a transistor, according to example embodiments.

DETAILED DESCRIPTION

Figure 1A:
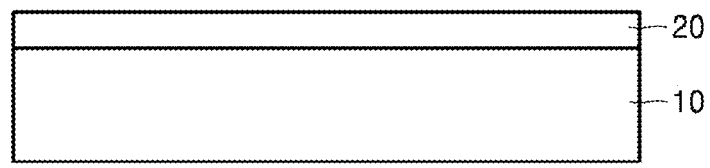
FIGS. 1A through 1C are cross-sectional view illustrating a method of forming a thin film, according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, thin films, methods of forming the thin films, semiconductor devices including the thin films, and methods of manufacturing the semiconductor devices, according to example embodiments, will be described in detail with reference to accompanying drawings. In the drawings, like reference numerals denote like elements, and the widths and thicknesses of layers and regions are exaggerated for clarity. Expressions such as "at least one of," when preceding a list of elements, modify the entire list of elements and do not modify the individual elements of the list.

Example embodiments relate to thin films, methods of forming the thin films, semiconductor devices including the thin films, and methods of manufacturing the semiconductor devices, and more particularly, to thin films including metal oxynitride, methods of forming the thin films, transistors including the thin films, and methods of manufacturing the transistors.

Figure 1B:
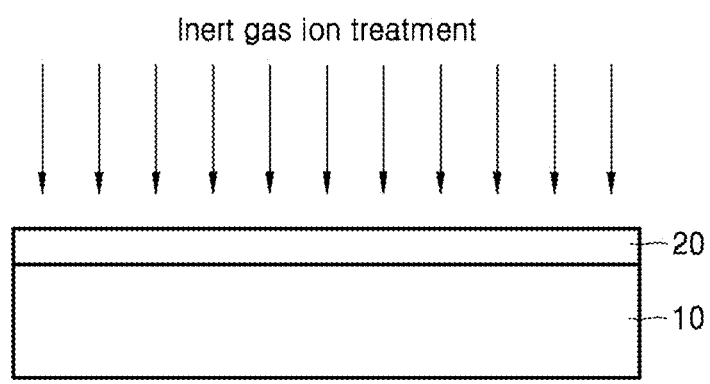
Figure 1C:
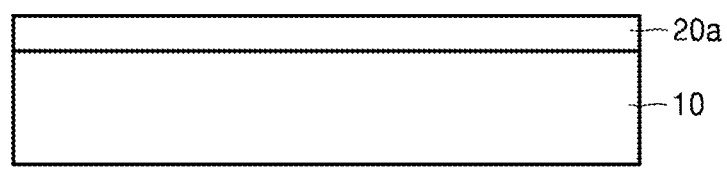

FIGS. 1A through 1C are cross-sectional view illustrating a method of forming a thin film, according to example embodiments.

Referring to FIG. 1A, a thin film 20 including a metal oxynitride may be formed on a substrate 10. The substrate 10 may be a glass substrate, and may alternatively be one of various substrates used in general semiconductor device processes, such as a plastic substrate or a silicon substrate. The thin film 20 may include zinc oxynitride or may include a zinc oxynitride-based metal oxynitride. That is, the thin film 20 may include $ZnO_{x1}N_{y1}$ or a $ZnO_{x1}N_{y1}$-based metal oxynitride (semiconductor). In the $ZnO_{x1}N_{y1}$, x1 may satisfy a condition "$0<x1<1$" and y1 may satisfy a condition "$0<y1<2/3$". Alternatively, x1 may satisfy a condition "$0<x1\leq1/2$" and y1 may satisfy a condition "$1/3\leq y1<2/3$". As a detailed example, the thin film 20 may be formed of $ZnO_{x1}N_{y1}$ or $ZnO_{x1}N_{y1}$—X (where X is an additional element). The additional element X in the $ZnO_{x1}N_{y1}$—X may be, for example, boron (B), aluminum (Al), gallium (Ga), indium (In), tin (Sn), titanium (Ti), zirconium (Zr), hafnium (Hf), silicon (Si), fluorine (F), chlorine (Cl), bromine (Br), iodine (I), sulfur (S), selenium (Se), phosphorous (P), lithium (Li), or the like. The thin film 20 may be deposited by using a physical vapor deposition (PVD) method such as a reactive sputtering method. However, the thin film 20 may be formed by using a method other than the reactive sputtering method, for example, a chemical vapor deposition (CVD) method, a metal organic chemical vapor deposition (MOCVD) method, an atomic layer deposition (ALD) method, or an evaporation method. A thickness of the thin film 20 may be from about 5 nm to about 150 nm, for example, from about 10 nm to about 100 nm.

Referring to FIG. 1B, the thin film 20 may be treated with inert gas ions. The inert gas ions may be, for example, argon (Ar) ions or neon (Ne) ions. The treating of the thin film 20 with the inert gas ions may be performed by a sputtering process. In this case, the sputtering process may be performed by using a relatively low acceleration voltage of about 0.5 keV to about 4.0 keV, for example, about 0.5 keV to about 2.0 keV. In addition, the sputtering process may be performed at a process pressure of about $10^{-7}$ Pa to about $10^{-6}$ Pa. The sputtering process may be performed for a duration of about 1 minute to 30 minutes. When the thin film 20 is treated with the inert gas ions under such conditions, desired changes in properties/characteristics may occur without causing etching of the thin film 20.

The treating of the thin film 20 with the inert gas ions may be performed by a plasma treatment process. In this case, the plasma treatment process may be performed by using a relatively low source power of about 50 W to 300 W, for example, for about 1 minute to 30 minutes.

In some cases, the treating of the thin film 20 with the inert gas ions may be performed by using ion implantation equipment. When treating the thin film 20 with the inert gas ions by using the ion implantation equipment, a treatment process may be performed at the level of applying ion bombardment to the thin film 20 rather than implanting ions into the thin film 20. Accordingly, the process may be an ion bombardment process.

The process of treating the thin film 20 with the inert gas ions may be a process that changes (stabilizes) physical/chemical characteristics of the thin film 20 by performing a bombardment on the thin film 20 with the ions or their plasma rather than implanting or doping the ions into the thin film 20. In addition, the process of treating the thin film 20 with the inert gas ions is not a process of etching the thin film 20 but a process that changes (stabilizes) physical/chemical characteristics of the thin film 20 while maintaining a form and thickness of the thin film 20. Accordingly, when treating the thin film 20 with the inert gas ions, treatment energy may be maintained at a relatively low level so that the thin film 20 is not etched or damaged. For example, when treating the thin film 20 by using a sputtering process, an acceleration voltage may be determined within the range of about 0.5 keV to about 4.0 keV, for example, about 0.5 keV to about 2.0 keV. Because a thickness of the thin film 20 is relatively small, the process of treating the thin film 20 with the inert gas ions may have a relatively uniform influence on the whole region of the thin film 20, and an effect of the process may almost uniformly appear in the whole region of the thin film 20. However, the above-mentioned effect/mechanism of the process is exemplary, and example embodiments are not limited thereto.

Additionally, the treating of the thin film 20 with the inert gas ions may be performed at a low temperature that is equal to or less than about 100° C., at room temperature (e.g., about 25° C.), or at a temperature similar to room temperature (e.g., about 18° C. to about 32° C.). Accordingly, a burden due to a high temperature process and a cost increase may be prevented.

As described above, the properties/characteristics of the thin film 20 may be stabilized by treating the thin film 20 with the inert gas ions. In the case of the thin film 20 including a metal oxynitride, for example, zinc oxynitride ($ZnO_{x1}N_{y1}$), the properties/characteristics of the thin film 200 may be easily changed and deteriorated because a bonding of nitrogen (N) elements in the thin film 20 is unstable. In more detail, when a zinc oxynitride ($ZnO_{x1}N_{y1}$) thin film is left in the air, oxygen (O) in the air may be easily substituted for nitrogen (N) elements of the zinc oxynitride ($ZnO_{x1}N_{y1}$) thin film, and also, the zinc oxynitride ($ZnO_{x1}N_{y1}$) thin film may easily react with moisture. Accordingly, over time, the zinc oxynitride ($ZnO_{x1}N_{y1}$) thin film is changed to a state similar to a ZnO thin film and original properties of the zinc oxynitride ($ZnO_{x1}N_{y1}$) thin film are lost. In another example embodiment, the zinc oxynitride ($ZnO_{x1}N_{y1}$) thin film may have a compositionally non-uniform state. That is, the distribution of nitrogen (N) elements and oxygen (O) elements in the zinc oxynitride ($ZnO_{x1}N_{y1}$) thin film may not be uniform. In addition, in the zinc oxynitride ($ZnO_{x1}N_{y1}$) thin film, a phase separation phenomenon in a nanoscale (for example, a scale of about 1 nm to about 10 nm) may occur. That is, crystalline ZnO, crystalline ZnN, and amorphous ZnON may exist together with each other in the zinc oxynitride ($ZnO_{x1}N_{y1}$) thin film. Each of the ZnO, ZnN, and ZnON is just a list of elements regardless of a composition ratio of the elements. For example, the expression 'ZnON' does not mean that a composition ratio of Zn, O, and N is 1:1:1, but means that ZnON is just an amorphous material formed of Zn, O, and N. The same meaning is applied to other parts of the present specification. In this manner, because the zinc oxynitride ($ZnO_{x1}N_{y1}$) thin film is compositionally non-uniform and a crystal phase thereof is also non-uniform, the zinc oxynitride ($ZnO_{x1}N_{y1}$) thin film may have unstable characteristics and properties that are easily changeable. In other words, it may be difficult to secure the stability of the zinc oxynitride ($ZnO_{x1}N_{y1}$). However, in the current example embodiments, by treating the thin film 20 with inert gas ions (for example, Ar ions or Ne ions) under a set (or predetermined) condition, a compositional uniformity and phase uniformity of the thin film 20 may be improved and a bonding between atoms (for example, a bonding between Zn and N) may be strengthened. Consequently, the properties/characteristics of the thin film 20 may be stabilized. In this regard, more detailed descriptions will be provided later.

Through the process of FIG. 1B, a stabilized thin film 20a may be obtained as illustrated in FIG. 1C. The stabilized thin film 20a may have excellent composition uniformity and phase uniformity. In addition, the stabilized thin film 20a may have a strengthened bonding between atoms (for example, strengthened Zn—N bonding). In this regard, properties/characteristics of the stabilized thin film 20a may be stably maintained without being changed for a long time.

The stabilized thin film 20a of FIG. 1C may include a metal oxynitride, for example, zinc oxynitride or a zinc oxynitride-based material. The stabilized thin film 20a may be represented by, for example, $ZnO_{x2}N_{y2}$. In the $ZnO_{x2}N_{y2}$, x2 may satisfy a condition "$0<x2<1$" and y2 may satisfy a condition "$0<y2<2/3$". Alternatively, x2 may satisfy a condition "$0<x2\leq 1/2$" and y2 may satisfy a condition "$1/3\leq y2<2/3$". Because in the process of FIG. 1B, the overall composition of the thin film 20 may be maintained intact or almost intact without being changed, the overall composition of the thin film 20 of FIG. 1A and the overall composition of the stabilized thin film 20a of FIG. 1C may be the same as, or almost similar to, each other. Accordingly, if the thin film 20 of FIG. 1A is represented by $ZnO_{x1}N_{y1}$ and the stabilized thin film 20a of FIG. 1C is represented by $ZnO_{x2}N_{y2}$, x2 and y2 of the $ZnO_{x2}N_{y2}$ may be the same as, or almost similar to, x1 and y1 of the $ZnO_{x1}N_{y1}$. If the thin film 20 of FIG. 1A is $ZnO_{x1}N_{y1}$—X (where X is an additional element), the stabilized thin film 20a of FIG. 1C may be $ZnO_{x2}N_{y2}$—X (where X is an additional element). The additional element X may be, for example, B, Al, Ga, In, Sn, Ti, Zr, Hf, Si, F, CI, Br, I, S, Se, P, Li, or the like.

Figure 2A:
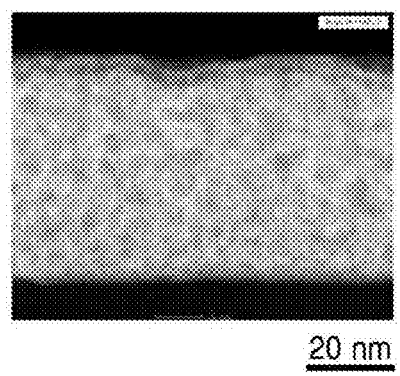
FIG. 2A is a diagram showing a high-angle annular dark-field scanning transmission electron microscope (HAADF STEM) image of a zinc oxynitride ($ZnO_xN_y$) thin film formed according to a comparative example.
Figure 2B:
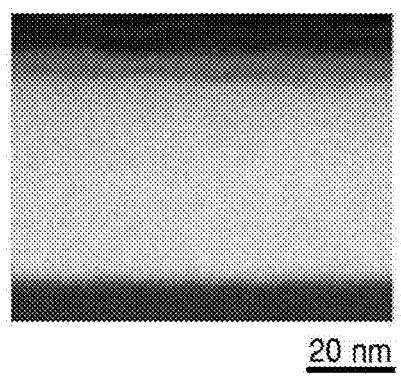
FIG. 2B is a diagram showing an HAADF STEM image of a zinc oxynitride ($ZnO_xN_y$) thin film formed according to example embodiments.

FIG. 2A shows a high-angle annular dark-field scanning transmission electron microscope (HAADF STEM) image of a zinc oxynitride ($ZnO_xN_y$) thin film formed according to a comparative example, and FIG. 2B shows an HAADF STEM image of a zinc oxynitride ($ZnO_xN_y$) thin film formed according to example embodiments.

The zinc oxynitride ($ZnO_xN_y$) thin film according to the comparative example is a thin film formed by depositing zinc oxynitride and then heat-treating the deposited zinc oxynitride for about one hour at a temperature of about 300° C. in a vacuum. The zinc oxynitride ($ZnO_xN_y$) thin film according to example embodiments is a thin film formed by depositing zinc oxynitride and then treating the deposited zinc oxynitride with Ar ions. In this case, the zinc oxynitride ($ZnO_xN_y$) thin film was treated with Ar ions by using a sputtering process. In the sputtering process, an acceleration voltage of the Ar ions is 1 keV, a base pressure (i.e., a pressure in a chamber) is $6.7 \times 10^{-6}$ Pa, and an extraction pressure is $\sim 1.5 \times 10^{-2}$ Pa.

The HAADF STEM images of FIGS. 2A and 2B are images captured under the conditions of a magnifying power greater than or equal to $\times 1M$ ($10^6$) and a camera length of 128 mm in a nano probe STEM mode. In this case, brightness is set under a condition in which image intensity is not saturated at any point of the images, and a resolution of about 0.1 nm is obtained through the control of astigmatism and focus. Each of the HAADF STEM images of FIGS. 2A and 2B is obtained from a specimen having a thickness of about 50 nm.

Referring to FIG. 2A, the brightness of the HAADF STEM image of the zinc oxynitride ($ZnO_xN_y$) thin film according to the comparative example is non-uniform in a nanoscale. This may be due to the non-uniformity of composition and the non-uniformity of phase (i.e., a phase separation).

Referring to FIG. 2B, the brightness of the HAADF STEM image of the zinc oxynitride ($ZnO_xN_y$) thin film according to example embodiments is almost uniform, showing that if a zinc oxynitride ($ZnO_xN_y$) thin film is formed according to example embodiments, that is, if a zinc oxynitride ($ZnO_xN_y$) thin film is treated with inert gas ions such as Ar, the composition of the zinc oxynitride ($ZnO_xN_y$) thin film is uniform and a phase separation (a phase separation in a nanoscale) hardly occurs.

Meanwhile, in FIGS. 2A and 2B, the brightness of a thin region of a thin film surface may be somewhat different from that of the other region due to a surface oxide film.

Figure 3A:
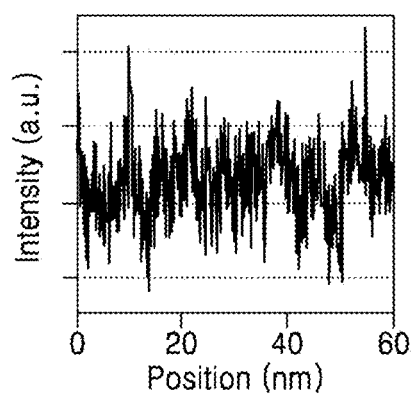
FIG. 3A is a graph illustrating intensity data measured from an HAADF STEM image of a zinc oxynitride ($ZnO_xN_y$) thin film formed according to a comparative example.
Figure 3B:
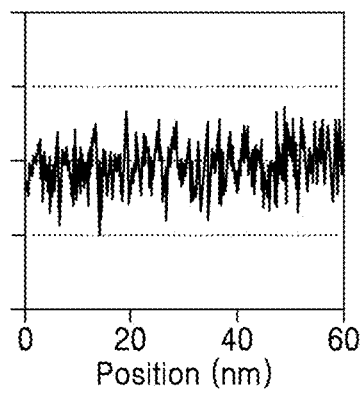
FIG. 3B is a graph illustrating intensity data measured from an HAADF STEM image of a zinc oxynitride ($ZnO_xN_y$) thin film formed according to example embodiments.

FIG. 3A is a graph illustrating intensity data measured from an HAADF STEM image of a zinc oxynitride ($ZnO_xN_y$) thin film formed according to a comparative example, and FIG. 3B is a graph illustrating intensity data measured from an HAADF STEM image of a zinc oxynitride ($ZnO_xN_y$) thin film formed according to example embodiments. The intensity data illustrated in FIG. 3A is measured from the image of FIG. 2A, and the intensity data illustrated in FIG. 3B is measured from the image of FIG. 2B.

Referring to FIG. 3A, in the zinc oxynitride ($ZnO_xN_y$) thin film according to the comparative example, the difference in intensity (brightness) is great according to positions.

Referring to FIG. 3B, in the zinc oxynitride ($ZnO_xN_y$) thin film according to example embodiments, the difference in intensity (brightness) is relatively small according to positions.

From the intensity data of FIG. 3A and FIG. 3B, "$(I_{max}-I_{min})/I_{avg}$" is calculated. $I_{max}$ and $I_{min}$ denote a maximum intensity and a minimum intensity of an HAADF STEM image, respectively, and Iavg denotes an average intensity of the HAADF STEM image. "$(I_{max}-I_{min})/I_{avg}$" of the intensity data illustrated in FIG. 3A is about 0.48, and "$(I_{max}-I_{min})/I_{avg}$" of the intensity data illustrated in FIG. 3B is about 0.21. That is, the difference in intensity (brightness) according to positions in the HAADF STEM image of the zinc oxynitride ($ZnO_xN_y$) thin film according to example embodiments is significantly smaller than that of the zinc oxynitride ($ZnO_xN_y$) thin film according to the comparative example. This means that the composition uniformity and phase uniformity of the zinc oxynitride ($ZnO_xN_y$) thin film according to example embodiments is more excellent than that of the zinc oxynitride ($ZnO_xN_y$) thin film according to the comparative example.

Figure 4A:
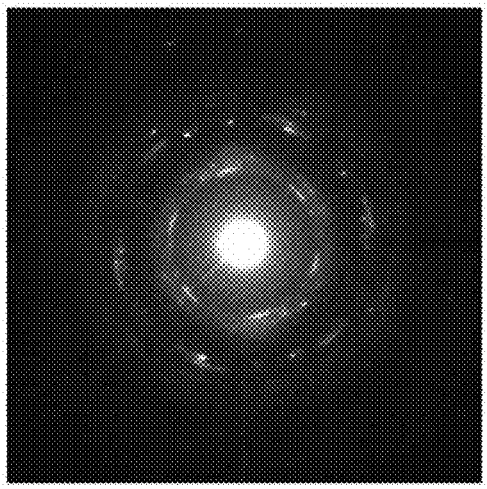
FIG. 4A is a diagram showing a diffraction pattern obtained from an HAADF STEM image of a zinc oxynitride ($ZnO_xN_y$) thin film formed according to a comparative example.
Figure 4B:
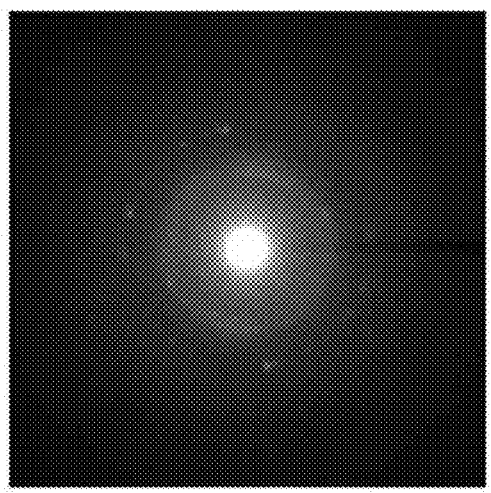
FIG. 4B is a diagram showing a diffraction pattern obtained from an HAADF STEM image of a zinc oxynitride ($ZnO_xN_y$) thin film formed according to example embodiments.

FIG. 4A shows a diffraction pattern obtained from an HAADF STEM image of a zinc oxynitride ($ZnO_xN_y$) thin film formed according to a comparative example, and FIG. 4B shows a diffraction pattern obtained from an HAADF STEM image of a zinc oxynitride ($ZnO_xN_y$) thin film formed according to example embodiments. The diffraction pattern shown in FIG. 4A is obtained from the image of FIG. 2A, and the diffraction pattern shown in FIG. 4B is obtained from the image of FIG. 2B.

Generally, in a diffraction pattern obtained from an STEM image, vivid dot and dash patterns indicate a crystalline structure, and broad circular bands of which boundaries are unclear and of which colors are light (faint) indicate an amorphous structure.

Referring to FIG. 4A, in the zinc oxynitride ($ZnO_xN_y$) thin film according to the comparative example, vivid dot and dash patterns are shown along with broad circular bands. This means that the zinc oxynitride ($ZnO_xN_y$) thin film according to the comparative example includes a relatively large number of crystalline structure and includes also an amorphous structure. The zinc oxynitride ($ZnO_xN_y$) thin film according to the comparative example may include all of crystalline ZnO, crystalline ZnN, and amorphous ZnON, and in this case, the percentage of the crystalline ZnO and ZnN may be relatively high.

Referring to FIG. 4B, in the zinc oxynitride ($ZnO_xN_y$) thin film according to example embodiments, dot and dash patterns are hardly shown and broad circular bands are mainly shown. This means that the zinc oxynitride ($ZnO_xN_y$) thin film according to example embodiments hardly includes crystalline ZnO and ZnN and includes mainly amorphous ZnON. That is, the zinc oxynitride ($ZnO_xN_y$) thin film according to example embodiments may have excellent uniformity in a crystalline phase. Each of the ZnO, ZnN, and ZnON is just a list of elements regardless of a composition ratio of the elements. For example, the expression 'ZnON' does not mean that a composition ratio of Zn, O, and N is 1:1:1, but means that ZnON is just an amorphous material formed of Zn, O, and N. The same meaning is applied to other parts of the present specification.

Based on the results of FIGS. 2 through 4 and other results (not shown) of example embodiments, which are similar to the result, the thin film according to example embodiments may satisfy the following inequality while including a metal oxynitride, e.g., zinc oxynitride ($ZnO_xN_y$).

$$(I_{max}-I_{min})/I_{avg}<0.3 \qquad \text{<Inequality>}$$

$I_{max}$ and $I_{min}$ denote a maximum intensity and a minimum intensity of an HAADF STEM image of the thin film, respectively, and $I_{avg}$ denotes an average intensity of the HAADF STEM image. The HAADF STEM image is an image captured by using a magnifying power greater than or equal to ×1M ($10^6$) under the condition of a camera length equal to or less than 150 mm in a nano probe STEM mode. In this case, brightness is set under a condition in which image intensity is not saturated at any point of the image, and resolution equal to or less than about 0.1 nm (e.g., resolution of about 0.1 nm) is obtained through the control of astigmatism and focus. The HAADF STEM image is an image obtained from a specimen having a thickness of about 30 nm to about 80 nm (e.g., a thickness of about 50 nm).

The metal oxynitride of the thin film according to example embodiments may include zinc oxynitride ($ZnO_xN_y$). The metal oxynitride may include amorphous zinc oxynitride (amorphous ZnON), and a content ratio of the amorphous ZnON in the thin film may be greater than or equal to about 80%, e.g., greater than or equal to about 90%. In the $ZnO_xN_y$, x may satisfy "0<x<1" and y may satisfy "0<y<⅔". Alternatively, x may satisfy "0<x≤½" and y may satisfy "⅓≤y<⅔". The thin film according to example embodiments may have excellent composition uniformity and phase uniformity and may have stable properties/characteristics.

Figure 5:
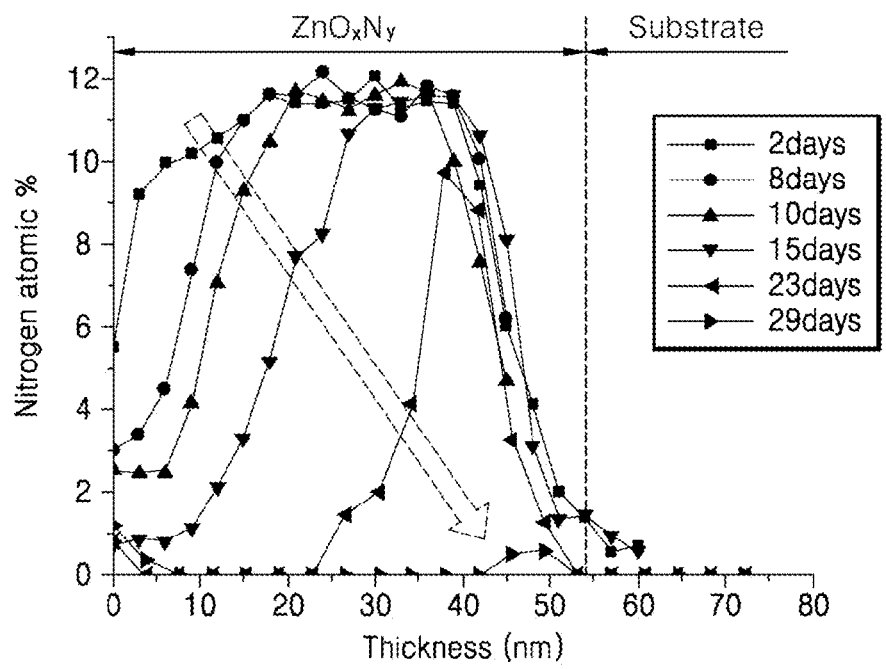

FIG. 5 is a graph illustrating an X-ray photoelectron spectroscopy (XPS) depth profile that shows changes in nitrogen (N) content according to time in a zinc oxynitride ($ZnO_xN_y$) thin film formed according to the comparative example.

Referring to FIG. 5, in the zinc oxynitride ($ZnO_xN_y$) thin film formed according to the comparative example, N is rapidly reduced with the lapse of time. N is reduced from the surface of the zinc oxynitride ($ZnO_xN_y$) thin film, and almost disappears in the whole thin film after a lapse of one month.

Figure 6:
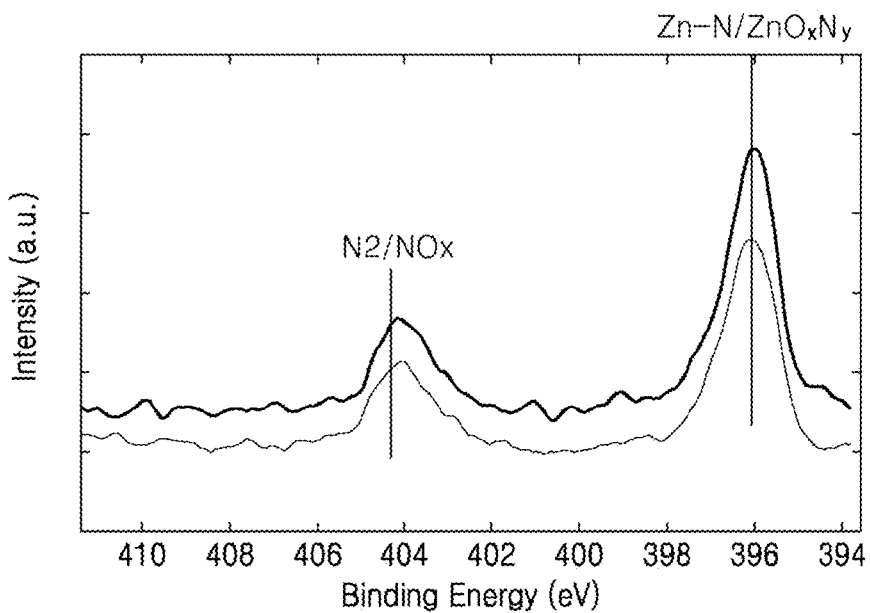

FIG. 6 is a graph illustrating an XPS composition analysis result of a zinc oxynitride ($ZnO_xN_y$) thin film formed according to example embodiments. The zinc oxynitride ($ZnO_xN_y$) thin film according to example embodiments is formed through an Ar ion treatment process using sputtering equipment, and an XPS composition analysis as illustrated in FIG. 2 is carried out after a lapse of two months after forming the zinc oxynitride ($ZnO_xN_y$) thin film.

Referring to FIG. 6, a peak corresponding to $N_2/NO_x$ bond and a peak corresponding to Zn—N/$ZnO_xN_y$ bond are clearly shown. Through this, it may be understood that in the case of the zinc oxynitride ($ZnO_xN_y$) thin film according to example embodiments, an N component of the zinc oxynitride ($ZnO_xN_y$) thin film is maintained intact even after a lapse of two months after forming the zinc oxynitride ($ZnO_xN_y$) thin film.

Figure 7:
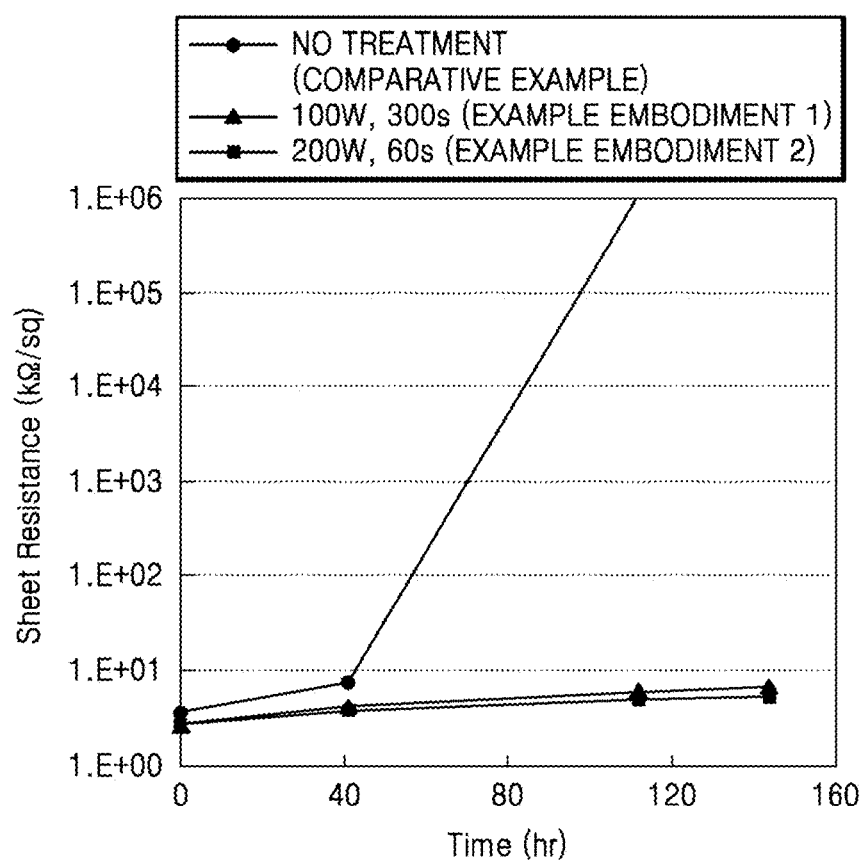

FIG. 7 is a graph illustrating changes in sheet resistance according to time in zinc oxynitride ($ZnO_xN_y$) thin films formed according to a comparative example and example embodiments.

In FIG. 7, the zinc oxynitride ($ZnO_xN_y$) thin film according to example embodiments is formed by treating zinc oxynitride with Ar ion plasma. A zinc oxynitride ($ZnO_xN_y$) thin film according to Example Embodiment 1 is a thin film formed by performing a plasma treatment for about 300 seconds by using a source power of about 100 W, and a zinc oxynitride ($ZnO_xN_y$) thin film according to Example Embodiment 2 is a thin film formed by performing a plasma treatment for about 60 seconds by using a source power of about 200 W. The zinc oxynitride ($ZnO_xN_y$) thin film according to the comparative example is a thin film formed without performing a plasma treatment. Changes in sheet resistance according to time are measured in a state in which the thin films are left in the air of room temperature.

Referring to FIG. 7, in the case of the zinc oxynitride ($ZnO_xN_y$) thin film according to the comparative example, sheet resistance rapidly increases after the lapse of about 40 hours because the resistance of the zinc oxynitride ($ZnO_xN_y$) thin film greatly increases as nitrogen (N) diffuses (or gets) out of the zinc oxynitride ($ZnO_xN_y$) thin film. In the case of the zinc oxynitride ($ZnO_xN_y$) thin films according to Example Embodiments 1 and 2, sheet resistance is hardly changed within a measuring time showing that stability of properties/characteristics of the zinc oxynitride ($ZnO_xN_y$) thin films according to Example Embodiments 1 and 2 are excellent.

Figure 8:
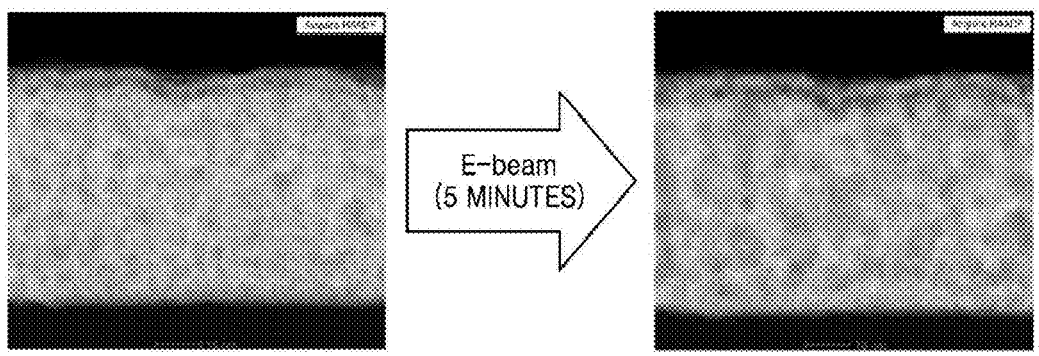

FIG. 8 is an HAADF STEM image showing deterioration due to an electron beam in a zinc oxynitride ($ZnO_xN_y$) thin film formed according to a comparative example.

Referring to FIG. 8, when the zinc oxynitride ($ZnO_xN_y$) thin film formed according to the comparative example is exposed to the electron beam, a difference in contrast of the HAADF STEM image increases. Through this result, it may be understood that composition non-uniformity and phase separation of the zinc oxynitride ($ZnO_xN_y$) thin film formed according to the comparative example deepened due to the electron beam.

Figure 9:
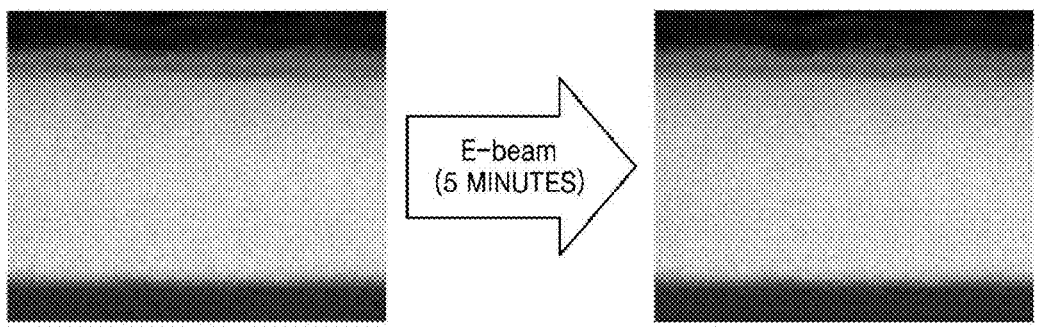

FIG. 9 is an HAADF STEM image showing influence of an electron beam on a zinc oxynitride ($ZnO_xN_y$) thin film formed according to example embodiments.

Referring to FIG. 9, the HAADF STEM image is hardly changed although the zinc oxynitride ($ZnO_xN_y$) thin film formed according to example embodiments is exposed to the electron beam. That is, the brightness of the HAADF STEM image is maintained almost uniform in the whole thin film although the zinc oxynitride ($ZnO_xN_y$) thin film formed according to example embodiments is exposed to the electron beam, showing that the zinc oxynitride ($ZnO_xN_y$) thin film formed according to example embodiment is stable and reliable.

The above-described thin film according to example embodiments and a method of manufacturing the thin film may be applied to various semiconductor devices (electronic devices). For example, the above-described thin film according to example embodiments and a method of manufacturing the thin film may be applied to transistors (thin film transistors).

FIGS. 10A through 10G are cross-sectional views illustrating a method of manufacturing a transistor, according to example embodiments.

In the present example embodiments, a thin film transistor (TFT) having a bottom gate structure is manufactured. However, example embodiments are not limited thereto.

Figure 10A:
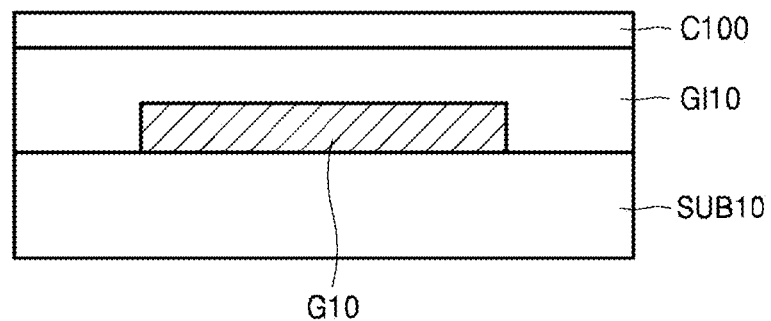
FIGS. 10A through 10G are cross-sectional views illustrating a method of manufacturing a transistor, according to example embodiments.

Referring to FIG. 10A, a gate electrode G10 may be formed on a substrate SUB10, and a gate insulation layer GI10 covering the gate electrode G10 may be formed. The substrate SUB10 may be a glass substrate, but alternatively may be one of various substrates used in a general semiconductor device process, such as a plastic substrate or a silicon substrate. The gate electrode G10 may be formed of a general electrode material, such as a metal or a conductive oxide. The gate insulation layer GI10 may be formed of a silicon oxide, a silicon oxynitride, a silicon nitride, or another material, such as a high dielectric material having a higher dielectric constant than a silicon nitride. The gate insulation layer GI10 may have a structure in which at least two layers of a silicon oxide layer, a silicon oxynitride layer, a silicon nitride layer, and a high dielectric material layer are stacked on each other.

Next, a channel material layer C100 may be formed on the gate insulation layer GI10. The channel material layer C100 may correspond to the thin film 20 of FIG. 1A. The channel material layer C100 may be formed of a metal oxynitride. The metal oxynitride may include zinc oxynitride or may include a zinc oxynitride-based material. That is, the metal oxynitride may include $ZnO_{x1}N_{y1}$ or a $ZnO_{x1}N_{y1}$-based material. In the $ZnO_{x1}N_{y1}$, x1 may satisfy a condition "$0<x1<1$" and y1 may satisfy a condition "$0<y1<2/3$". Alternatively, x1 may satisfy a condition "$0<x1 \le 1/2$" and y1 may satisfy a condition "$1/3 \le y1 < 2/3$". As a detailed example, the channel material layer C100 may be formed of $ZnO_{x1}N_{y1}$ or $ZnO_{x1}N_{y1}$—X (where X is an additional element). The additional element X in the $ZnO_{x1}N_{y1}$—X may be, for example, B, Al, Ga, In, Sn, Ti, Zr, Hf, Si, F, Cl, Br, I, S, Se, P, Li, or the like. The channel material layer C100 may be deposited by using a PVD method such as a reactive sputtering method. However, the channel material layer C100 may be formed by using a method other than the reactive sputtering method, for example, a CVD method, an MOCVD method, an ALD method, or an evaporation method. The channel material layer C100 may be formed to have a thickness of about 5 nm to about 150 nm, for example, from about 10 nm to about 100 nm. However, a range of the thickness of the channel material layer C100 may be changed.

Figure 10B:
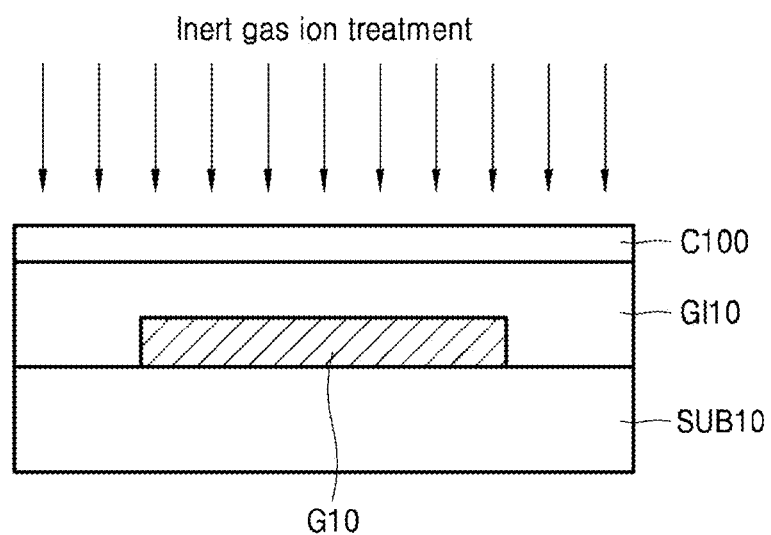

Referring to FIG. 10B, the channel material layer C100 may be treated with inert gas ions. The inert gas ions may be, for example, Ar ions or Ne ions. The treating of the channel material layer C100 with the inert gas ions may be performed by a sputtering process. In this case, the sputtering process may be performed by using a relatively low acceleration voltage of about 0.5 keV to about 4.0 keV, for example, about 0.5 keV to about 2.0 keV. In addition, the sputtering process may be performed in a process pressure of about $10^{-7}$ Pa to about $10^{-6}$ Pa. The sputtering process may be performed for a duration of about 1 minute to 30 minutes. When the channel material layer C100 is treated with the inert gas ions under such conditions, changes in properties/characteristics may occur without causing etching of the channel material layer C100. The treating of the channel material layer C100 with the inert gas ions may be performed by a plasma treatment. In this case, the plasma treatment process may be performed by using a relatively low source power of about 50 W to 300 W, for example, for about 1 minute to 30 minutes. In some cases, the treating of the channel material layer C100 with the inert gas ions may be performed by using ion implantation equipment. Also when treating the channel material layer C100 with the inert gas ions by using the ion implantation equipment, a treatment process may be performed at the level of applying ion bombardment to the channel material layer C100 rather than implanting ions into the channel material layer C100.

As in FIG. 10B, the properties/characteristics of the channel material layer C100 may be stabilized by treating the channel material layer C100 with the inert gas ions. By treating the channel material layer C100 with the inert gas ions under a set (or predetermined) condition, a compositional uniformity and phase uniformity of the channel material layer C100 may be improved and a bonding between atoms (for example, a bonding between Zn and N) may be strengthened. Consequently, the properties/characteristics of the channel material layer C100 may be stabilized. Descriptions related to this may be the same as those provided above with reference to FIG. 1B.

Figure 10C:
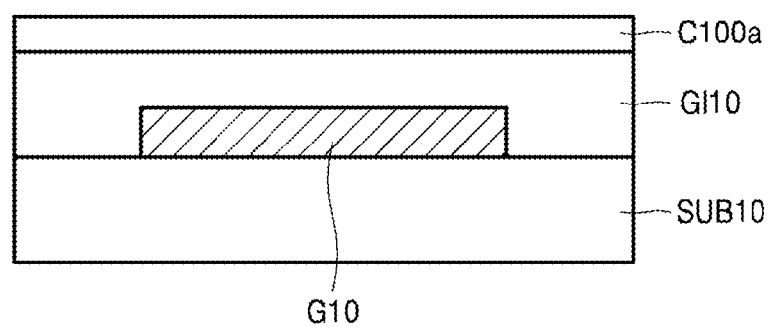

Through the process of FIG. 10B, a stabilized channel material layer C100a may be obtained as illustrated in FIG. 10C. The stabilized channel material layer C100a may have excellent composition uniformity and phase uniformity. In addition, the stable channel material layer C100a may have a strengthened bonding between atoms. Material composition/characteristics of the stabilized channel material layer C100a may be the same as those of the stabilized thin film 20a of FIG. 1C. The stabilized channel material layer C100a of FIG. 10C may include $ZnO_{x2}N_{y2}$ or $ZnO_{x2}N_{y2}$-based material. In the $ZnO_{x2}N_{y2}$, x2 may satisfy a condition "$0<x2<1$" and y2 may satisfy a condition "$0<y2<2/3$". Alternatively, x2 may satisfy a condition "$0<x2 \le 1/2$" and y2 may satisfy a condition "⅓≤y2<⅔". The stabilized channel material layer C100a of FIG. 10C may also include $ZnO_{x2}N_{y2}$—X (where X is an additional element). The additional element X may be, for example, B, Al, Ga, In, Sn, Ti, Zr, Hf, Si, F, Cl, Br, I, S, Se, P, Li, or the like.

Figure 10D:
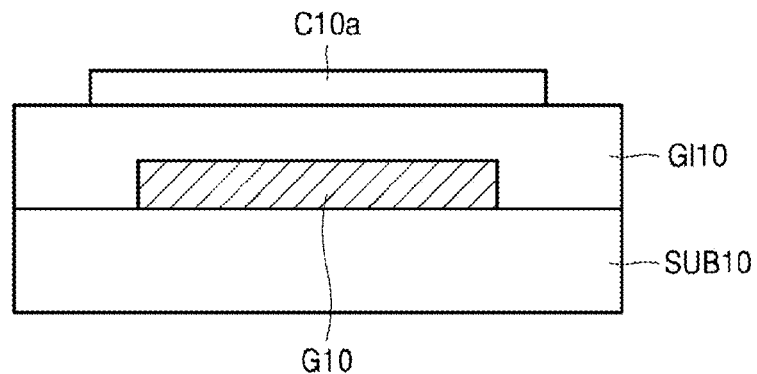

Next, as illustrated in FIG. 10D, a stabilized channel layer C10a (hereinafter, referred to as a channel layer) may be formed by patterning (etching) the stabilized channel material layer C100a. In some cases, without patterning (etching) the stabilized channel material layer C100a, the stabilized channel material layer C100a may be used as a channel layer.

Figure 10E:
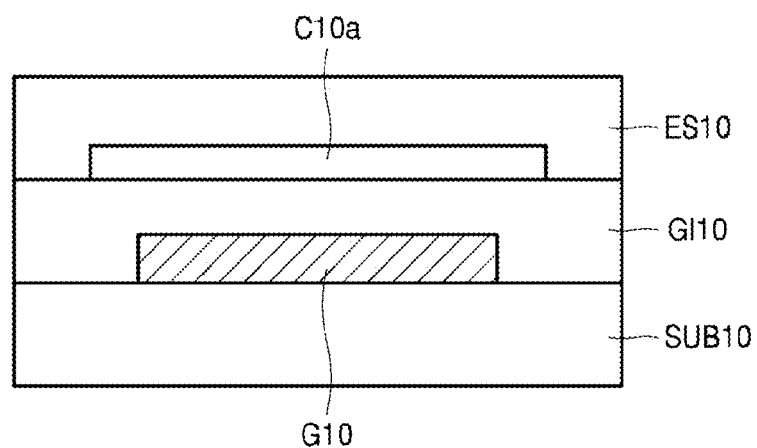

Referring to FIG. 10E, an etch stop layer ES10 covering the channel layer C10a may be formed on the gate insulation layer GI10. The etch stop layer ES10 may be formed of, for example, silicon oxide, silicon nitride, an organic insulation material, or the like.

Figure 10F:
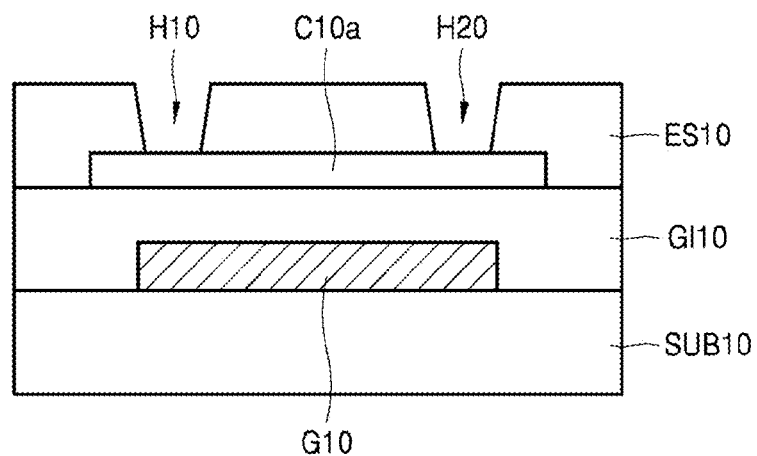

Referring to FIG. 10F, first and second contact holes H10 and H20 may be formed in the etch stop layer ES10. The first and second contact holes H10 and H20 may be formed to respectively expose first and second regions of the channel layer C10a. The first region may be one edge of the channel layer C10a or a region adjacent to the edge, and the second region may be the other edge of the channel layer C10a or a region adjacent to the other edge.

Figure 10G:
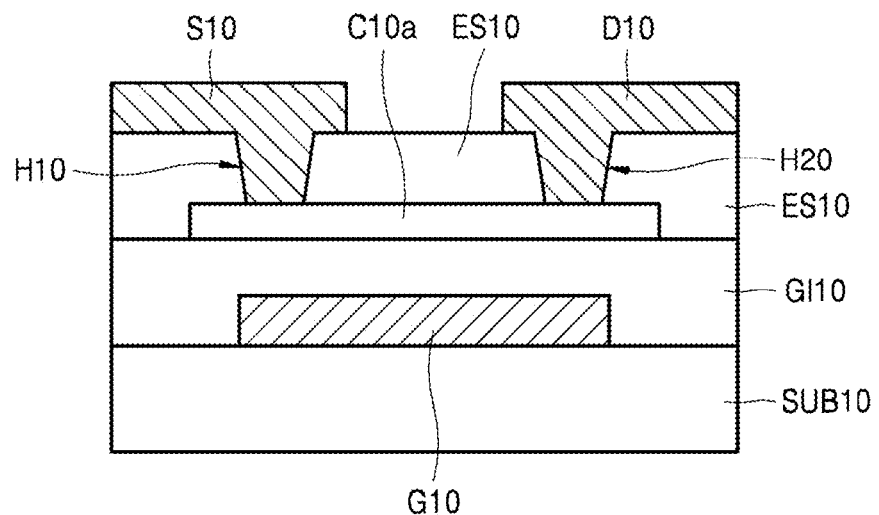

Referring to FIG. 10G, a source electrode S10 and a drain electrode D10 that contact respectively the first and second regions of the channel layer C10a, which are exposed by the first and second contact holes H10 and H20, may be formed on the etch stop layer ES10. The source electrode S10 and the drain electrode D10 may be formed of the same material as, or a different material from, the gate electrode G10. The source electrode S10 and the drain electrode D10 may include a single layer or a multi-layer. The source electrode S10 and the drain electrode D10 may be formed by forming a source/drain conductive layer and patterning (etching) the source/drain conductive layer. In this case, during the patterning (etching), the etch stop layer ES10 may protect a region of the channel layer C10a between the source electrode S10 and the drain electrode D10. However, the formation of the etch stop layer ES10 is optional. In particular, in the case that properties/characteristics of the channel layer C10a have been stabilized according to example embodiments, the source electrode S10 and the drain electrode D10 may be formed without using the etch stop layer ES10.

Although not illustrated, a passivation layer covering the source and drain electrodes S10 and D10 may be formed on the etch stop layer ES10. The passivation layer may be a silicon oxide layer, a silicon oxynitride layer, a silicon nitride layer, or an organic insulation layer, or may have a structure in which at least two thereof are stacked on each other. The transistor formed according to such a method may be annealed at a set (or predetermined) or given temperature.

In this manner, according to example embodiments, after forming the channel layer C10a including a metal oxynitride (e.g., zinc oxynitride) and having stable properties/characteristics, a transistor including the channel layer C10a may be manufactured. Because the properties/characteristics of the channel layer C10a are in a stable state, processes after the formation of the channel layer C10a may be easily performed and a transistor using the channel layer C10a may have excellent performance and high reliability. For example, a transistor using the channel layer C10a may have excellent electrical reliability and electro-optical reliability. If a channel layer (a zinc oxynitride thin film) having unstable properties/characteristics is used, various process issues may occur in subsequent steps, and the performance and reliability of a transistor including the channel layer may be deteriorated.

FIGS. 11A through 11D are cross-sectional views illustrating a method of manufacturing a transistor, according to other example embodiments.

In the present example embodiments, a TFT having a top gate structure is manufactured.

Figure 11A:
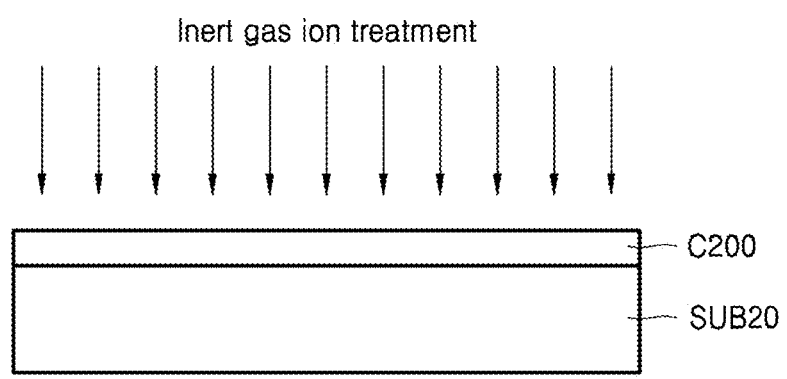
FIGS. 11A through 11D are cross-sectional views illustrating a method of manufacturing a transistor, according to other example embodiments.

Referring to FIG. 11A, a channel material layer C200 including a metal oxynitride, e.g., zinc oxynitride ($ZnO_{x1}N_{y1}$), may be formed on a substrate SUB20. A material, a thickness, properties, etc. of the channel material layer C200 may be the same as, or similar to, the channel material layer C100 of FIG. 10A. Next, the channel material layer C200 may be treated with inert gas ions. The inert gas ions may be, for example, Ar ions or Ne ions. A method of treating the channel material layer C200 with the inert gas ions may be the same as, or similar to, that explained with reference to FIG. 10B.

Figure 11B:
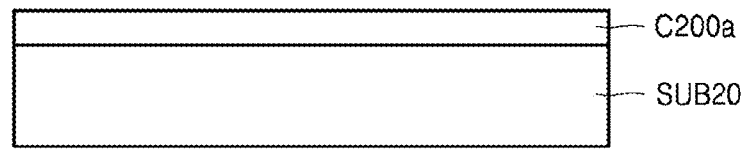

By treating the channel material layer C200 with the inert gas ions, a stabilized channel material layer C200a may be obtained as illustrated in FIG. 11B. Material composition/characteristics of the stabilized channel material layer C200a may be the same as those of the stabilized thin film 20a of FIG. 1C.

Figure 11C:
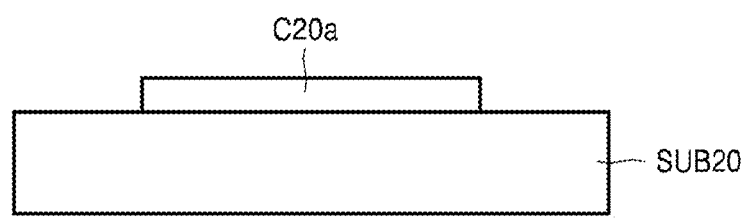

By patterning the stabilized channel material layer C200a, a stabilized channel layer (hereinafter, referred to as a channel layer) C20a may be formed as illustrated in FIG. 11C. In some cases, without patterning (etching) the stabilized channel material layer C200a, the stabilized channel material layer C200a may be used as a channel layer.

Figure 11D:
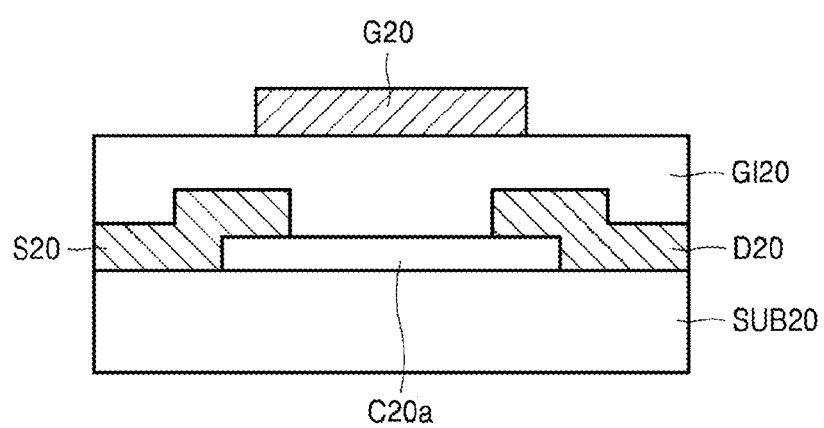

Referring to FIG. 11D, source and drain electrodes S20 and D20 electrically connected to the channel layer C20a may be formed on the substrate SUB20. Next, a gate insulation layer GI20 covering the channel layer C20a, the source electrode S20, and the drain electrode D20 may be formed. The gate insulation layer GI20 may be formed of the same or similar material as the gate insulation layer GI10 of FIG. 11A. Next, a gate electrode G20 may be formed on the gate insulation layer GI20. The gate electrode G20 may be formed above the channel layer C20a. The gate electrode G20 may be formed of the same, or a different, material as, or from, the source and drain electrodes S20 and D20. A passivation layer (not shown) covering the gate electrode G20 may be formed on the gate insulation layer GI20. The passivation layer may be a silicon oxide layer, a silicon oxynitride layer, a silicon nitride layer, or an organic insulation layer, or may have a structure wherein at least two thereof are stacked on each other. The transistor formed as such may be annealed at a set (or predetermined) or given temperature.

Structures (i.e., device structures) of FIG. 10G and FIG. 11D correspond to a structure of a transistor according to example embodiments. The channel layer C10a or C20a may correspond to the "thin film" according to example embodiments. The channel layer C10a or C20a may include a metal oxynitride, e.g., zinc oxynitride ($ZnO_xN_y$), and may satisfy a conditional inequality "$(I_{max}-I_{min})/I_{avg}<0.3$". $I_{max}$ and $I_{min}$ denote a maximum intensity and a minimum intensity of an HAADF STEM image of the channel layer C10a or C20a, respectively, and $I_{avg}$ denotes an average intensity of the HAADF STEM image. The HAADF STEM image is an image captured by using a magnifying power greater than, or equal to, ×1M ($10^6$) under the condition of a camera length equal to, or less than, 150 mm in a nano probe STEM mode. In this case, brightness is set under a condition in which image intensity is not saturated at any point of the image, and a resolution equal to, or less than, about 0.1 nm (e.g., resolution of about 0.1 nm) is obtained through the control of astigmatism and focus. The HAADF STEM image is an image obtained from a specimen having a thickness of about 30 nm to about 80 nm (e.g., a thickness of about 50 nm).

The metal oxynitride of the channel layer C10a or C20a according to example embodiments may include zinc oxynitride ($ZnO_xN_y$). The metal oxynitride may include amorphous zinc oxynitride (amorphous ZnON), and the percentage of the amorphous ZnON in the channel layer C10a or C20a may be greater than or equal to about 80%, e.g., greater than or equal to about 90%. The channel layer C10a or C20a according to example embodiments may have excellent composition uniformity and phase uniformity and may have stable properties/characteristics.

The structures of FIG. 10G and FIG. 11D are exemplary structures and may be variously modified. Various modification examples are illustrated in FIGS. 12 through 15.

Figure 12:
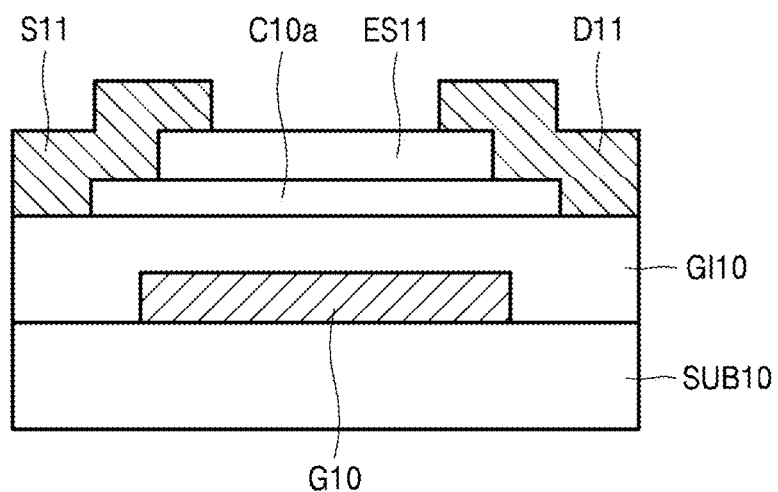
Figure 13:
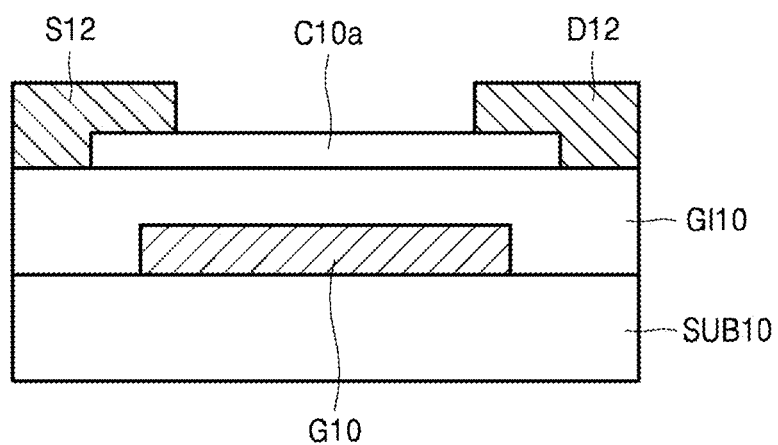
Figure 14:
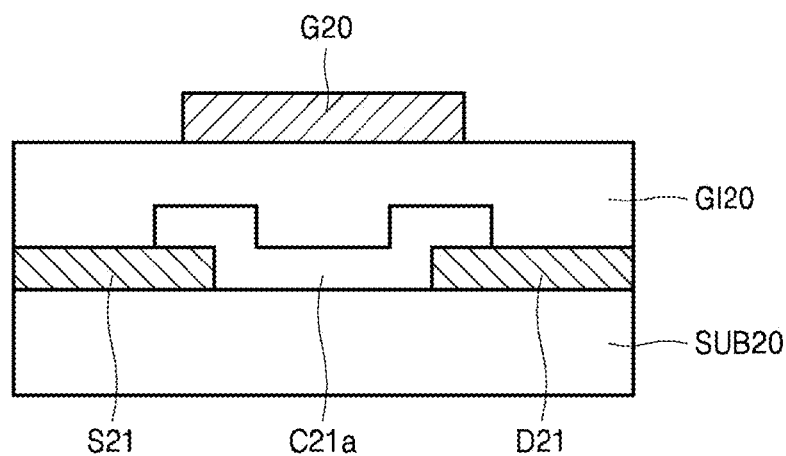
Figure 15:
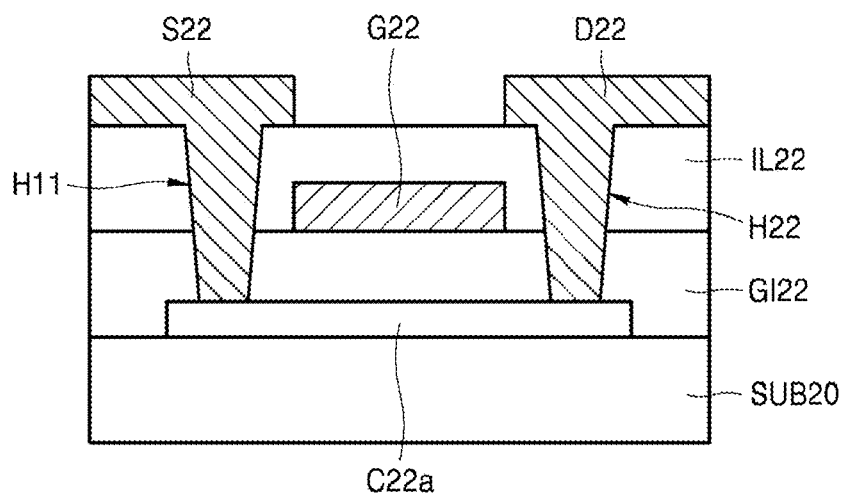

FIGS. 12 and 13 show structures modified from the structure of FIG. 10G, and FIGS. 14 and 15 show structures modified from the structure of FIG. 11D.

Referring to FIG. 12, a gate electrode G10 and a gate insulation layer GI10 covering the gate electrode G10 may be disposed on a substrate SUB10, and a channel layer C10a may be disposed on the gate insulation layer GI10. An etch stop layer ES11 may be disposed on the channel layer C10a. A width of the etch stop layer ES11 in the horizontal direction in FIG. 12 may be smaller than that of the channel layer C10a. Both edges of the channel layer C10a may not be covered by the etch stop layer ES11. A source electrode S11 may cover one edge of the channel layer C10a and a portion of the etch stop layer ES11 adjacent to the edge of the channel layer C10a, and a drain electrode D11 may cover another edge of the channel layer C10a and a portion of the etch stop layer ES11 adjacent to the other edge of the channel layer C10a. The source electrode S11 and the drain electrode D11 may each have a structure extending above the gate insulation layer GI10. Although not illustrated, a passivation layer covering the source electrode S11, the drain electrode D11, and the etch stop layer ES11 may be further disposed.

The etch stop layer ES11 may not be included as shown in FIG. 13.

Referring to FIG. 13, a source electrode S12 may cover one edge of the channel layer C10a, and a drain electrode D12 may cover another edge of the channel layer C10a, without an etch stop layer therebetween. According to example embodiments, because the properties/characteristics of the channel layer C10a become stable, the properties/characteristics of the channel layer C10a may be maintained without deteriorating although the source electrode S12 and the drain electrode D12 is formed without an etch stop layer therebetween.

FIG. 14 is a cross-sectional view of a transistor according to other example embodiments. FIG. 14 illustrates a modified structure of the structure of FIG. 11D.

Referring to FIG. 14, a source electrode S21 and a drain electrode D21, which are spaced separated from each other, may be disposed on a substrate SUB20. A channel layer C21a may be disposed on the substrate SUB20 between the source and drain electrodes S21 and D21. The channel layer C21a may be connected to the source and drain electrodes S21 and D21. The channel layer C21a may cover facing edges of the source and drain electrodes S21 and D21. A gate insulation layer GI20 covering the channel layer C21a, the source electrode S21, and the drain electrode D21 may be disposed on the substrate SUB20. A gate electrode G20 may be disposed on the gate insulation layer GI20. A passivation layer (not shown) covering the gate electrode G20 may be further disposed on the gate insulation layer GI20. The structure of FIG. 14 may be identical to the structure of FIG. 11D, except the locations and shapes of the channel layer C21a, the source electrode S21, and the drain electrode D21.

FIG. 15 is a cross-sectional view of a transistor having a top gate structure, according to other example embodiments. FIG. 15 illustrates a modified structure of the structure of FIG. 11D.

Referring to FIG. 15, a channel layer C22a may be disposed on a substrate SUB20, and a gate insulation layer GI22 may cover the channel layer C22a. A gate electrode G22 may be disposed on the gate insulation layer GI22, and an interlayer insulation layer IL22 may cover the gate electrode G22. First and second contact holes H11 and H22 exposing first and second regions of the channel layer C22a may be formed in the interlayer insulation layer IL22 and the gate insulation layer GI22. A source electrode S22 may be disposed in the first contact hole H11, and a drain electrode D22 may be disposed in the second contact hole H22. The source and drain electrodes S22 and D22 may extend above the interlayer insulation layer IL22. A material, a thickness, properties, etc. of the channel layer C22a may be the same as or similar to those of the channel layer C20a of FIG. 11D.

As described above, according to example embodiments, transistors each including a metal oxynitride (e.g., $ZnO_xN_y$) as a channel layer material and having excellent performance (high mobility or the like) and high reliability may be implemented.

The transistors according to example embodiments may be used as a switching device or a driving device of a display device, such as a liquid crystal display device or an organic light-emitting display device. As described above, because the transistors according to example embodiments have high mobility and excellent stability/reliability, a performance of a display device may be improved when the transistor is applied to the display device. Alternatively, the transistors may not only be applied to a display device, but may be used for various purposes in fields of other electronic devices, such as memory devices and logic devices.

Figure 16:
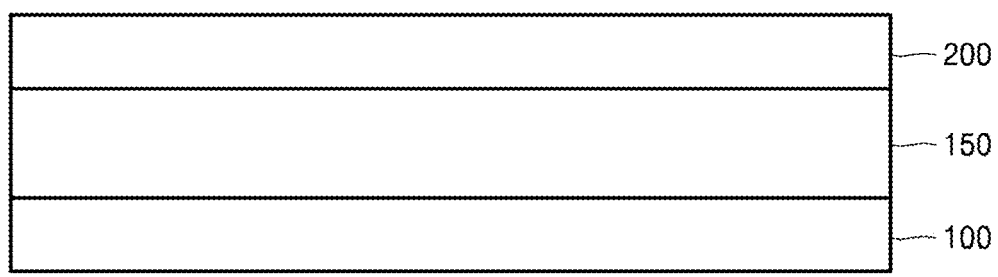

FIG. 16 is a cross-sectional view of an electronic device (display device) including a transistor, according to example embodiments. The electronic device (display device) of the present example embodiments is a liquid crystal display (LCD) device.

Referring to FIG. 16, a liquid crystal layer 150 may be disposed between a first substrate 100 and a second substrate 200. The first substrate 100 may be an array substrate including at least one of the transistors of the example embodiments, for example, the transistors of FIGS. 10G, 11D, and 12 through 15, as a switching device or a driving device. The first substrate 100 may include a pixel electrode (not shown) connected to the transistor. The second substrate 200 may include a counter electrode (not shown) corresponding to the pixel electrode. A liquid crystal arrangement of the liquid crystal layer 150 may differ according to a voltage applied between the first and second substrates 100 and 200. The structure of the electronic device including the transistor, according to example embodiments, is not limited to the structure of FIG. 16, and may vary.

It should be understood that example embodiments described herein should be considered in a descriptive sense only and not for purposes of limitation. For example, it would be obvious to one of ordinary skill in the art that the thin film manufacturing method of FIGS. 1A through 1C and the thin film formed thereby, the transistor manufacturing methods of FIGS. 10A through 11D and the transistors formed thereby, the transistors of FIGS. 12 through 15, and the structure of the electronic device (display device) of FIG. 16 and the method of manufacturing the electronic device (display device) may vary. For example, using another metal oxynitride other than zinc oxynitride ($ZnO_xN_y$) may also provide effects similar to those of example embodiments. In addition, the thin film according to the above example embodiments may be applied to various semiconductor devices other than a transistor. Also, the transistors according to the above example embodiments may be applied to one of various electronic devices other than the display device of FIG. 16, for various purposes. Accordingly, descriptions of features within each example embodiment should typically be considered as available for other similar features in other example embodiments.

What is claimed is:

1. A method of forming a thin film, the method comprising:
   forming a preliminary thin film including a metal oxynitride on a substrate; and
   treating the preliminary thin film with inert gas ions to form the thin film having stabilized properties, the thin film being a semiconductor film, wherein
      the treating of the preliminary thin film with the inert gas ions includes performing a sputtering process, the sputtering process including using an acceleration voltage of about 0.5 keV to about 4.0 keV.

2. The method of claim 1, wherein the metal oxynitride includes zinc oxynitride.

3. The method of claim 1, wherein the inert gas ions include at least one selected from Ar ions and Ne ions.

4. The method of claim 1, wherein the sputtering process is performed under a pressure of about $10^{-7}$ Pa to about $10^{-6}$ Pa.

5. The method of claim 1, wherein the treating of the preliminary thin film with the inert gas ions is performed at about room temperature.

6. A thin film formed according to the method of claim 1.

7. A thin film, comprising:
   a metal oxynitride, wherein
      the thin film satisfies the following inequality of EQUATION (1), $$(I_{max} - I_{min})/I_{avg} < 0.3 \qquad \text{EQUATION (1)}$$

where $I_{max}$ and $I_{min}$ denote a maximum intensity and a minimum intensity of a high-angle annular dark-field scanning transmission electron microscope (HAADF STEM) image of the thin film, respectively, and
   where $I_{avg}$ denotes an average intensity of the HAADF STEM image.

8. The thin film of claim 7, wherein the metal oxynitride includes zinc oxynitride.

9. The thin film of claim 8, wherein
   the metal oxynitride includes amorphous zinc oxynitride, and
   a content ratio of the amorphous zinc oxynitride in the thin film is greater than or equal to 80%.

10. A method of manufacturing a transistor, the method comprising:
    forming a channel layer including a thin film, a gate electrode, a source electrode, and a drain electrode,
    wherein the thin film is formed according to the method of claim 1.

11. The method of claim 10, further comprising:
    forming an etch stop layer on the channel layer.

12. A transistor, comprising:
    a channel layer formed of a metal oxynitride;
    a gate electrode corresponding to the channel layer;
    a source electrode connected to a first region of the channel layer; and
    a drain electrode connected to a second region of the channel layer, wherein
       the channel layer satisfies the following inequality of EQUATION (1)

$$(I_{max} - I_{min})/I_{avg} < 0.3 \qquad \text{EQUATION (1)}$$

where $I_{max}$ and $I_{min}$ denote a maximum intensity and a minimum intensity of a high-angle annular dark-field scanning transmission electron microscope (HAADF STEM) image of the channel layer, respectively, and
   where $I_{avg}$ denotes an average intensity of the HAADF STEM image.

13. The transistor of claim 12, wherein the metal oxynitride includes zinc oxynitride.

14. The transistor of claim 13, wherein
    the metal oxynitride includes amorphous zinc oxynitride, and
    a content ratio of the amorphous zinc oxynitride in the channel layer is greater than or equal to 80%.

15. The transistor of claim 12, further comprising:
    an etch stop layer on the channel layer.

* * * * *